(12) United States Patent
Bayer et al.

(10) Patent No.: US 6,200,408 B1
(45) Date of Patent: Mar. 13, 2001

(54) METHOD FOR CEMENTING A COMPONENT TO A SURFACE

(75) Inventors: Heiner Bayer, Olching; Ernst Wipfelder, Munich, both of (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/341,927

(22) PCT Filed: Feb. 5, 1998

(86) PCT No.: PCT/DE98/00317

§ 371 Date: Jul. 20, 1999

§ 102(e) Date: Jul. 20, 1999

(87) PCT Pub. No.: WO98/34992

PCT Pub. Date: Aug. 13, 1998

(30) Foreign Application Priority Data

Feb. 10, 1997 (DE) .............................................. 197 05 027

(51) Int. Cl.$^7$ .............................. B32B 31/28; B32B 31/26
(52) U.S. Cl. ..................................... 156/273.3; 156/275.7; 156/330
(58) Field of Search .............................. 156/273.3, 275.1, 156/275.3, 275.5, 275.7, 330; 522/100

(56) References Cited

U.S. PATENT DOCUMENTS 5,447,797 * 9/1995 Stapp et al. .......................... 428/413

* cited by examiner

*Primary Examiner*—Michael W. Ball
*Assistant Examiner*—Michael A. Tolin
(74) *Attorney, Agent, or Firm*—Schiff Hardin & Waite

(57) ABSTRACT

A rapid and precise cementing of components to a surface is achieved using a specially modified cement on an epoxy base in that the parts to be cemented are precisely aligned at the cemented location, are fixed with UV light and are subsequently thermally hardened.

14 Claims, No Drawings

METHOD FOR CEMENTING A COMPONENT TO A SURFACE

BACKGROUND OF THE INVENTION

The present invention relates generally to the adhering of a component, such as an electronic, electric or optical component to a surface using an adhesive or a cement. More specifically, the present invention relates to a method for bonding a component to a surface using an epoxy-based cement or adhesive made in accordance with the present invention.

In many technical fields, workpieces are already being connected and fastened exclusively by cementing. Conventional fastening methods such as soldering, welding, screwing or the like are thus being supplanted by cement or adhesives. For the constantly expanding fields of use, cements are needed which must satisfy a wide variety of requirements. In electronics and optical communications technology, reactive resins are being increasingly used for reliable and cost-effective assembly of different materials reasons of production technology, one-component systems are desirable, it being possible to employ these for bonding directly, without additional preprocessing. However, it is disadvantageous here that the one-component systems can only be rapidly hardened at increased temperatures. Short cycle times which as are necessary for an automatic production are thus difficult to achieve.

For different cementing problems, particularly in optical communications technology, a precise aligning of the components to be cemented is required. This must occur prior to the final hardening, whereby it is often necessary to fix the aligned components until hardening since the cement passes through a low-viscosity state during hardening. In addition, the cement can comprise a shrinking behavior, which in turn results in a misalignment.

Besides the de-aligning, the thermal load exhibited during the hardening of one-component reactive resins can lead to strong tensions or even to damage to the parts, or respectively, components to be cemented. In addition, the temperature sensitivity of parts that are to be cemented can limit the hardening temperature, thus necessitating cements that harden at lower temperatures.

One possibility for rapid fixing is offered by UV-hardenable cements. However, in many cases these do not comprise the necessary combination of properties that leads to a lasting, and reliable bond. Thus, in many cases a second bonding agent is employed, usually an epoxy resin, in order to guarantee the reliability and permanence of the cemented connection. This has the disadvantage that light-hardening resin and epoxy resin can be disadvantageously influenced. Furthermore, the mere need for two different bonding agents is undesirable in and of itself.

German Patent Application No. 40 38 989 teaches a bonding method with the aid of a cationically initiated hardenable epoxy resin wherein the cement is activated with the aid of UV light and can then be hardened thermally at a relatively mild temperature. It is disadvantageous in this method that a heating of the cemented location must occur for rapid fixing, and the transfer of a sufficient amount of heat is necessary. This limits the cycle times in automatic production methods. In addition, this cement hardens only where an illumination occurs, not at points where an illumination does not occur at all.

Another problem is to find a cement that is suitable for thermoplastic surfaces which enables a rapid and exact hardening.

SUMMARY OF THE INVENTION

It is thus an object of the present invention to provide a method for the rapid and exact cementing of two joint parts, at least one of which can comprise a thermoplastic surface.

These and other objects are achieved by a method in accordance with the present invention which comprises the steps of depositing a cement in a seam disposed between the component and the surface to which the component is to be bonded to, joining the surfaces to be bonded, aligning the component with the surface, fixing the component to the surface by UV/VIS illumination, and, heating the component and surface to thermally harden the cemented location.

In an embodiment, the method of the present invention comprises the steps of filling a seam disposed between the component and the surface with a cement to produce a cemented location, the cement comprising an epoxy-based cement comprising from about 20 to about 70 percent by weight of a cationically hardenable solvent-free epoxy comprising a conversion product of a cycloaliphatic diepoxy and an aromatic compound that comprises OH-groups, from about 10 to about 60 percent by weight of a compound comprising multiple hydroxyl groups, from about 0.02 to about 2 percent by weight of a cationic photoinitiator, from about 0.02 to about 2 percent by weight of a latent thermal initiator comprising a thiolanium salt, and from about 20 to 60 percent by volume of a filler with a maximum particle size of 50 $\mu$m, and wherein the cemented location comprises a thermoplastic surface, aligning the component on the surface, irradiating the cement with electromagnetic radiation in the UV/VIS region thereby fixing the cemented location, heating the cemented location to thermally harden the cemented location.

In an embodiment, the irradiation of the cement occurs over a time period ranging from about 0.1 to about 10 seconds.

In an embodiment, the component comprises a metallic or a metallized surface that faces the seam.

In an embodiment, the seam has a thickness ranging from about 20 to about 200 $\mu$m.

In an embodiment, the filler comprises an inorganic filler.

In an embodiment, the filler comprises a mineral filler.

In an embodiment, the cement is applied to the component.

In an embodiment, the cement is applied to the surface.

In an embodiment, the component is selected from the group consisting of an electrical component, an electronic component and an optical component and the method is carried out within a cycle time ranging from about 0.1 to about 10 seconds.

A cement on an epoxy base is used which is modified with polyol and which contains initiators for both light-induced cationic hardening and for thermal hardening. Surprisingly, it has been demonstrated that with this type of cement a rapid and sufficiently reliable fixing of the cemented location is possible by means of UV illumination with a UV lamp, for example. The fixing, occurs within a maximum time of 15 seconds and can be achieved in a 5-second irradiation period already in an exemplifying embodiment. It is still possible to achieve significantly shorter illumination times with a UV laser. By means of the cationic catalyzer, it is sufficient to illuminate only a proportionally small surface of the cement, or respectively, of the cemented location and still to achieve a sufficient fixing of the overall cemented connection.

The complete hardening can occur in a later tempering step at relatively moderate temperatures of 130 to 150° C., for example. It is thus possible first to fix several cemented locations simultaneously or successively and then to thermally harden the cemented locations jointly. Several cemented locations can thus be situated on a common substrate.

Surprisingly, it has also been demonstrated that, with the inventive method, sufficiently fast cemented connections can be produced between components, at least one of which comprises a thermoplastic surface. For such cementing problems there were previously no known satisfactory solutions based on UV-hardenable epoxy resins.

Particularly good cemented connections are obtained between thermoplastic surfaces and metallic or metallized surfaces. Gold-plated parts of electronic components which are to be connected to precise injection-molded parts made of thermoplastic can serve as an example here.

For a particularly low-shrinkage cemented location with a low thermal coefficient of expansion, a cement is used which contains an inorganic or mineral filler in a proportion of 20 to 60 percent by volume.

Fillers are preferably on a silicic acid base, such as quartz meal or quartz ware meal. Extra-fines with a maximum particle diameters of 10 to 50 $\mu$m are preferably used, these enabling a miniaturizing of cemented locations. With cements of this type, rather thin seams can be realized with a spacing of the joined surfaces of a few micrometers.

In certain instances, details which are not necessary for an understanding of the present invention or which render other details difficult to perceive may have been omitted. It should be understood, of course, that the invention is not necessarily limited to the particular embodiments illustrated herein.

DETAILED DESCRIPTION OF THE PRESENTLY PREFERRED EMBODIMENTS

A cement comprising the following components is preferably inventively which comprises:

- 20 to 70 percent by weight of a cationically hardenable solvent-free epoxy
- 10 to 60 percent by weight of a compound containing multiple hydroxyl groups
- 0.02 to 2 percent by weight of a cationic photoinitiator
- 0.02 to 2 percent by weight of a latent thermal initiator for the cationic polymerization on the basis of a thiolanium salt
- 20 to 60 percent by volume of a mineral filler with a maximum particle size of 50 $\mu$m (corresponding to 27 to 80 percent by weight given a filler on a salicic acid base).

Arbitrary epoxies can be employed, such as glycidyl ethers on a base of bisphenol A, bisphenol F or novolaks. Glycidyl ethers of multiple alcohols such as glycerin and pentaerythritol are also suitable. Linear aliphatic epoxies such as epoxidated polybutadiene and epoxidated soybean oil are also suitable. But cycloaliphatic epoxies such as 3,4-epoxicyclohexylmethyl-3',4',-epoxicyclohexane carboxylate are particularly suitable. The latter are distinguished by a high reactivity and a low viscosity. Mixtures of other cationically hardenable epoxies can also be added in.

The compound that contains hydroxyl groups is preferably a multivalent aliphatic or cycloaliphatic alcohol. Glycols or other aliphatic diols, trifuinctional or tetrafunctional alcohols such as trimethylol propane or ethers of glycols with phenols or bisphenols can be used, for example. Other suitable compounds are polymer-polyols which are used in the production of polyurethanes. For example, the polyols marketed by Dow Chemical under the trade names Niax® and Tone® bear mentioning here.

It is also possible to use compounds that contain hydroxyl groups such compounds as are obtained by a reaction of epoxy compounds with alcohols or phenols. The addition product of a cycloaliphatic epoxy with a polyphenol, preferably with a bisphenol such as bisphenol A or naphthalene diol, is quite suitable. Such addition products can be obtained in a base-catalyzed manner under mild conditions. A preferred addition product is a 2:1 addition compound in which an equivalent of the phenolic groups is transposed by two equivalents of epoxy groups. Assuming one diepoxy and one bisphenol, the 2:1 addition product is likewise a diepoxy. If the molar ratio is selected in the range from 2:1 to 20:1, preferably from 3:1 to 10:1, then the addition product, or respectively, the reaction mixture containing the addition product, has almost no more free phenolic OH-groups. But the reaction mixture contains hydroxyl groups, however, since a β-residing hydroxy group emerges next to the ether compound, due to the addition of a phenol to the epoxy group.

If said reaction product with a high epoxy excess is used for the compound that contains hydroxyl groups, then the reaction product can be used in the cement both instead of the epoxy and instead of the compound that contains hydroxyl groups.

To initiate the cationic hardening, a cationic photoinitiator or a cationic photoinitiator system is contained. Its share of the total epoxy resin can be 0.1 to 5 percent by weight. Given UV irradiation, these photoinitiators release reactive cations such as protons, which initiate the cationic hardening process of the epoxy resin. The photoinitiators are derived from stable organic onium salts, particularly with nitrogen, phosphorus, oxygen, sulfur, selenium or iodine as the central atom of the cation. Aromatic sulfonium salts and iodonium salts with complex anions have proven particularly advantageous. A photoinitiator which releases a Lewis acid and is realized as a pi-donor transition metal complex is also possible. Phenacyl sulfonium salts and hydroxyphenyl sulfonium salts and sulfoxonium salts also bear mentioning. Onium salts can also be used which are not excited to acid formation directly, but via a sensitizer. Organic silicon compounds which release a silanol given UV irradiation in the presence of aluminum organic compounds can also be used for the cationic hardening process.

As photoinitiator, the following sulfonium salt is very suitable. It is a main component of Cyracure® UVI 6974 (Union Carbide):

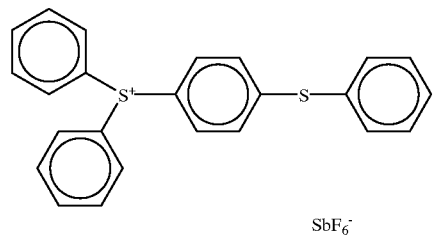

As a latent thermal initiator for the cationic polymerization, a thiolanium salt is contained, preferably with the following general structure:

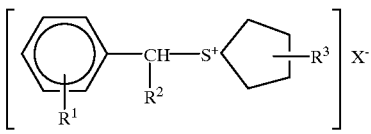

whereby R1 is hydrogen, alkyl, aryl, alkoxy, thioether, halogen, CN or NO$_2$; R2 is hydrogen, alkyl or aryl; R3 is hydrogen, alkyl or aryl or an aromatic system that is condensed at the thiolane ring; X$^-$=PF$_6^-$; AsF$_6^-$ or SbF$_6^-$.

Unsubstituted benzylthiolanium salts are preferably employed, particularly benzylthiolanium hexafluoroantimonate.

Mineral extra-fines on a silicate acid base, such as quartz meals or quartz ware meals, are particularly suitable fillers.

With the use of said cement, a rapid fixing of the parts to be bonded can be inventively achieved. A time-span of less than one second can be sufficient for this. On the other hand, the cement is sufficiently stable at room temperature or processing temperature so that at room temperature there is a storage time of up to one year, and at a processing temperature of 40° C., for example, there is a processing time of about one week. This guarantees good processibility in automated processes without necessitating an overly frequent cleaning of the processing apparatuses and of the cement applicator device, in particular.

The invention is detailed below with the aid of exemplifying embodiments.

For the exemplifying embodiment, three cement mixtures V1 to V3 are mixed according to the following table. The amounts are given in parts by weight.

|  | V1 | V2 | V3 |
| --- | --- | --- | --- |
| cycloaliphatic epoxy (CY179, ciba) | 66 | 90 | 33 |
| addition product of bisphenol A to cycloaliphatic epoxy (OH 117, Siemens) | 13 | 30 | 6 |
| epoxidated soybean oil (Edenol D20, Henkel) | 12 | 25 | 5 |
| trimethylol propane (Merck) | 8 | 2 |  |
| cyclohexane dimethanol (Merck) |  | 8 |  |
| pentane diol (Merck) |  | 7 |  |
| TCD-alcohol (Hoechst) |  |  | 2 |
| cationic photoinitiator (UVI 6974, UCC) | 1.4 | 11 | 0.7 |
| cationic thermal initiator (benzyl thiolanium hexafluoro-antimonate Aldrich) | 1 | 2 | 0.5 |
| adhesion agent (A 187 UCC) | 0.4 | 0.5 | 0.3 |
| flow promoter (Modaflow, Brenntag) | 0.2 | 0.3 | 0.1 |
| quartz ware meal (FB-3SX, Denka) | 190 | 90 |  |
| quartz ware meal (FW 600, Denka) |  | 150 |  |
| quartz ware meal (VP 810) |  | 10 |  |
| Fill level | 65% | 50% | 65% |

To test the shearing strength, test bodies made of different materials are bonded to one another. To this end, one of the surfaces to be bonded is coated with a thin cement layer 50 to 100 μm thick, the part to be bonded is placed thereon, the cemented locations are irradiated with UV light from the side (5 seconds with 50 mW/cm$^2$), and the cemented locations are finally completely hardened at 150° for 30 minutes.

Shear strength tests are performed on a microtester. It is thus demonstrated that metal metal cemented joints yield an excellent shear strength of up to 20 N/mm$^2$. Thermoplastic test bodies which were bonded to metal substrates also demonstrated high shear strengths of up to 10 N/mm$^2$. The following thermoplasts were cemented to aluminum and demonstrated a sufficient adhesion: LCP (Zenite 6330), PPS (Fortron 6165), PEEK (LFM 100-12). In the shearing tests, a cohesion break occurs only given high shearing forces; the boundary surface to the thermoplast usually breaks or the thermoplast itself breaks in a layer near the surface.

The glass conversion temperature of the given cement is in the range from 130 to 150° C. (DSC).

The inventive method and the appertaining cement are particularly suited to the automatic bonding of components of electronics and of optoelectronics in which a high precision is required. The sufficiently long pot life along with the extremely rapid fixability with UV light enables short cycle times and thus a high machine throughput. The overall hardenability is achieved relatively quickly and at mild temperatures of approximately 130 to 150° C. In this way, thermally sensitive components can also be cemented. A particular advantage of the inventive method is the ability to cement thermoplastic parts to metal parts, in particular, or to surfaces of a different nature. The cements exhibit little shrinkage and enable precisely aligned cemented joints with very low tolerances. The joint can be realized with thin seams of 80±20 μm, for example.

From the above description, it is apparent that the objects of the present invention have been achieved. While only certain embodiments have been set forth, alternative embodiments and various modifications will be apparent from the above description to those skilled in the art. These and other alternatives are considered equivalents and within the spirit and scope of the present invention.

What is claimed is:

1. A method for bonding a component to a surface comprising the steps of:

filling a seam disposed between the component and the surface with a cement to produce a cemented location, the cement comprising an epoxy-based cement comprising from about 20 to about 70 percent by weight of a cationically hardenable solvent-free epoxy comprising a conversion product of a cycloaliphatic diepoxy and an aromatic compound that comprises OH-groups, from about 10 to about 60 percent by weight of a compound comprising multiple hydroxyl groups, from about 0.02 to about 2 percent by weight of a cationic photoinitiator, from about 0.02 to about 2 percent by weight of a latent thermal initiator comprising a thiolanium salt, and from about 20 to 60 percent by volume of a filler with a maximum particle size of 50 μm, and wherein the cemented location comprises a thermoplastic surface;

aligning the component on the surface;

irradiating the cement with electromagnetic radiation in the UV/VIS region thereby fixing the cemented location;

heating the cemented location to thermally harden the cemented location.

2. The method of claim 1 wherein the component comprises a metallic or a metallized surface that faces the seam.

3. The method of claim 1 wherein the seam has a thickness ranging from about 20 to about 200 μm.

4. The method of claim 1 wherein the filler comprises an inorganic filler.

5. The method of claim 1 wherein the filler comprises a mineral filler.

6. The method of claim 1 wherein the cement is applied to the component.

7. The method of claim 1 wherein the cement is applied to the surface.

8. The method of claim 1 wherein the component is selected from the group consisting of an electrical component, an electronic component and an optical component and the method is carried out within a cycle time ranging from about 0.1 to about 10 seconds.

9. A method for bonding a component selected from the group consisting of an electrical component, an electronic component and an optical component to a surface, the method comprising the steps of:

filling a seam disposed between the component and the surface with a cement to produce a cemented location, the cement comprising an epoxy-based cement comprising from about 20 to about 70 percent by weight of a cationically hardenable solvent-free epoxy comprising a conversion product of a cycloaliphatic diepoxy and an aromatic compound that comprises OH-groups, from about 10 to about 60 percent by weight of a compound comprising multiple hydroxyl groups, from about 0.02 to about 2 percent by weight of a cationic photoinitiator, from about 0.02 to about 2 percent by weight of a latent thermal initiator comprising a thiolanium salt, and from about 20 to 60 percent by volume of an inorganic filler with a maximum particle size of 50 $\mu$m, and wherein the cemented location comprises a thermoplastic surface;

aligning the component on the surface;

irradiating the cement with electromagnetic radiation in the UV/VIS region over a time period ranging from about 0.1 to about 10 seconds thereby fixing the cemented location;

heating the cemented location to thermally harden the cemented location.

10. The method of claim 9 wherein the component comprises a metallic or a metallized surface that faces the seam.

11. The method of claim 10 wherein the seam has a thickness ranging from about 20 to about 200 $\mu$m.

12. The method of claim 11 wherein the filler further comprises a mineral filler.

13. The method of claim 11 wherein the cement is applied to the component.

14. The method of claim 11 wherein the cement is applied to the surface.

* * * * *